(12) United States Patent
Zheng et al.

(10) Patent No.: US 12,158,626 B2
(45) Date of Patent: Dec. 3, 2024

(54) OPTICAL MODULE

(71) Applicant: Hisense Broadband Multimedia Technologies Co., Ltd., Shandong (CN)

(72) Inventors: Long Zheng, Shandong (CN); Sigeng Yang, Shandong (CN)

(73) Assignee: HISENSE BROADBAND MULTIMEDIA TECHNOLOGIES CO., LTD., Qingdao (CN)

(*) Notice: Subject to any disclaimer, the term of this patent is extended or adjusted under 35 U.S.C. 154(b) by 607 days.

(21) Appl. No.: 17/364,327

(22) Filed: Jun. 30, 2021

(65) Prior Publication Data
US 2021/0356683 A1    Nov. 18, 2021

Related U.S. Application Data

(63) Continuation-in-part of application No. PCT/CN2020/114570, filed on Sep. 10, 2020.

(30) Foreign Application Priority Data

May 13, 2020   (CN) .......................... 202010404349.7

(51) Int. Cl.
*G02B 6/42*         (2006.01)
*H01S 5/02251*    (2021.01)
(Continued)

(52) U.S. Cl.
CPC ........... *G02B 6/428* (2013.01); *G02B 6/4204* (2013.01); *G02B 6/4244* (2013.01); *G02B 6/4269* (2013.01); *H01S 5/0239* (2021.01)

(58) Field of Classification Search
CPC . G02B 6/138; G02B 6/30; G02B 6/32; G02B 6/325; G02B 6/3652; G02B 6/3692;
(Continued)

(56) References Cited

U.S. PATENT DOCUMENTS

| 5,481,629 A * | 1/1996 | Tabuchi | G02B 6/4204 |
| | | | 385/35 |
| 8,103,140 B2 * | 1/2012 | Strandjord | G01C 25/00 |
| | | | 385/11 |

(Continued)

FOREIGN PATENT DOCUMENTS

| CN | 108390256 A | 8/2018 |
| CN | 108761670 A | 11/2018 |

(Continued)

OTHER PUBLICATIONS

Office Action issued in corresponding Chinese Patent Application No. 202010404349.7 dated Feb. 2, 2021, with English translation.
(Continued)

*Primary Examiner* — Ryan A Lepisto
*Assistant Examiner* — Erin D Chiem
(74) *Attorney, Agent, or Firm* — Morgan, Lewis & Bockius LLP

(57) ABSTRACT

An optical module includes a shell, a circuit board, a light source, and a silicon optical chip. The circuit board is located in the shell, a hollow portion is provided in the circuit board, and the hollow portion penetrates the circuit board. The light source includes at least one laser assembly, and the at least one laser assembly is mounted on the shell and is located in the hollow portion, and the at least one laser assembly is electrically connected to the circuit board. The silicon optical chip is mounted on the shell and is located in the hollow portion. The silicon optical chip is electrically connected to the circuit board and is connected to the light source.

18 Claims, 9 Drawing Sheets

(51) Int. Cl.
*H01S 5/02325* (2021.01)
*H01S 5/0239* (2021.01)
*H01S 5/024* (2006.01)
*H05K 1/02* (2006.01)

(58) Field of Classification Search
CPC ...... G02B 6/42; G02B 6/4212; G02B 6/4215; G02B 6/4219; G02B 6/4224; G02B 6/4228; G02B 6/4232; G02B 6/4236; G02B 6/424; G02B 6/4266; G02B 6/4272; G02B 6/4277; G02B 6/4283; G02B 6/4286; G02B 6/4287; G02B 6/4296
See application file for complete search history.

(56) References Cited

U.S. PATENT DOCUMENTS

| | | | | |
|---|---|---|---|---|
| 10,097,272 | B2* | 10/2018 | Dong | H04B 10/503 |
| 2010/0006784 | A1* | 1/2010 | Mack | G02B 6/43 |
| | | | | 250/551 |
| 2012/0327668 | A1* | 12/2012 | Chan | G02B 6/4201 |
| | | | | 362/362 |
| 2015/0098675 | A1* | 4/2015 | Ishiyama | G02B 6/4284 |
| | | | | 385/14 |
| 2019/0029102 | A1 | 1/2019 | Chen et al. | |
| 2020/0233160 | A1 | 7/2020 | Lee | |
| 2020/0295528 | A1 | 9/2020 | Du et al. | |

FOREIGN PATENT DOCUMENTS

| | | |
|---|---|---|
| CN | 109239861 A | 1/2019 |
| CN | 110326172 A | 10/2019 |
| CN | 110376688 A | 10/2019 |
| CN | 110388576 A | 10/2019 |
| CN | 110730599 A | 1/2020 |
| CN | 110764202 A | 2/2020 |
| CN | 111474644 A | 7/2020 |
| JP | 2844999 B2 | 1/1999 |
| KR | 10-2016-0017806 A | 2/2016 |

OTHER PUBLICATIONS

International Search Report and Written Opinion issued in corresponding International Application No. PCT/CN2020/114570 dated Jan. 27, 2021, with English translation.

* cited by examiner

OPTICAL MODULE

CROSS-REFERENCE TO RELATED APPLICATIONS

This application is a continuation-in-part of International Application No. PCT/CN2020/114570 filed on Sep. 10, 2020, which claims priority to Chinese Application No. 202010404349.7, filed with the Chinese Patent Office on May 13, 2020, which are incorporated herein by reference in their entireties.

TECHNICAL FIELD

The present disclosure relates to the field of optical communication technologies, and in particular, to an optical module.

BACKGROUND

Optical communication technologies are used in new services and applications such as cloud computing, mobile internet, and video conference. In the optical communication, an optical module is a tool for achieving interconversion between an optical signal and an electrical signal, and is one of key devices in an optical communication apparatus.

SUMMARY

An optical module is provided. The optical module includes a shell, a circuit board, a light source and a silicon optical chip. The circuit board is located in the shell, a hollow portion is provided in the circuit board, and the hollow portion penetrates the circuit board. The light source is mounted on the shell and is located in the hollow portion; the light source includes at least one laser assembly, and the at least one laser assembly is electrically connected to the circuit board. The silicon optical chip is mounted on the shell and is located in the hollow portion. The silicon optical chip is electrically connected to the circuit board and is connected to the light source.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
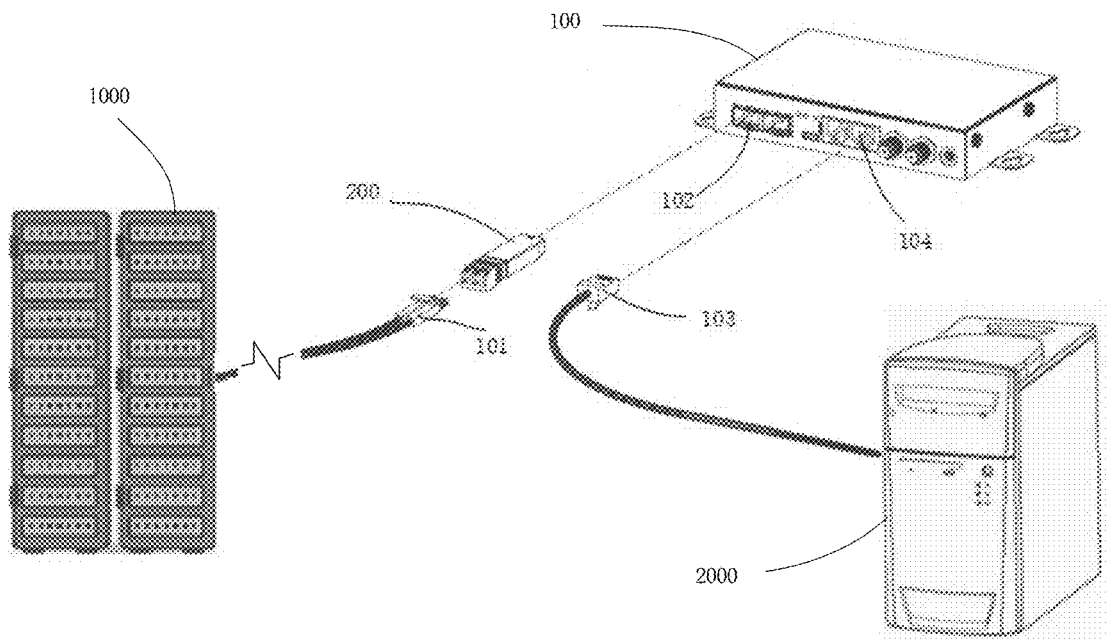
FIG. 1 is a diagram of a connection relationship of an optical communication system, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, that is, "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first", "second" are used for descriptive purposes only, and are not to be construed as indicating or implying the relative importance or implicitly indicating the number of indicated technical features. Thus, features defined with "first", "second" may explicitly or implicitly include one or more of the features. In the description of the embodiments of the present disclosure, the term "a/the plurality of" means two or more unless otherwise specified.

In the description of some embodiments, the term "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The use of the phrase "applicable to" or "configured to" herein means an open and inclusive expression, which does not exclude devices that are applicable to or configured to perform additional tasks or steps.

The term "about", "approximately" or "substantially" as used herein includes a stated value and an average value within an acceptable range of deviation of a particular value. The acceptable range of deviation is determined by a person of ordinary skill in the art in view of the measurement in question and the error associated with a particular amount of measurement (i.e., the limitations of the measurement system).

In optical communication technology, an optical signal is used to carry information to be transmitted, and the optical signal carrying the information is transmitted to an information processing device such as a computer through an information transmission device such as an optical fiber or an optical waveguide to achieve a transmission of the information. Since the optical signal has a characteristic of passive transmission when being transmitted through the optical fiber or the optical waveguide, low-cost and low-loss information transmission may be achieved. In addition, a signal transmitted by the information transmission device such as the optical fiber or the optical waveguide is the optical signal, while a signal that can be recognized and processed by the information processing device such as the computer is an electrical signal. Therefore, in order to establish information connection between the information transmission device such as the optical fiber or the optical waveguide and the information processing device such as the computer, interconversion between the electrical signal and the optical signal needs to be achieved.

An optical module implements a function of interconversion between the optical signal and the electrical signal in the field of optical fiber communication technology. The optical module includes an optical port and an electrical port. The optical module achieves optical communication with the information transmission device such as the optical fiber or the optical waveguide through the optical port. And the optical module achieves electrical connection with an optical network terminal (e.g., an optical modem) through the electrical port. The electrical connection is mainly to achieve power supply, transmission of an I2C signal, transmission of a data signal and grounding. The optical network terminal transmits the electrical signal to the information processing device such as the computer through a network cable or wireless fidelity (Wi-Fi).

FIG. 1 is a diagram showing a connection relationship of an optical communication system in accordance with some embodiments. As shown in FIG. 1, the optical communication system mainly includes a remote server 1000, a local information processing device 2000, an optical network terminal 100, an optical module 200, an optical fiber 101, and a network cable 103.

One end of the optical fiber 101 is connected to the remote server 1000, and another end thereof is connected to the optical network terminal 100 through the optical module 200. The optical fiber itself may support long-distance signal transmission, such as signal transmission of several kilometers (6 kilometers to 8 kilometers). Based on this, if a repeater is used, infinite-distance transmission may be achieved theoretically. Therefore, in a typical optical communication system, a distance between the remote server 1000 and the optical network terminal 100 may typically reach several kilometers, tens of kilometers, or hundreds of kilometers.

One end of the network cable 103 is connected to the local information processing device 2000, and another end thereof is connected to the optical network terminal 100. The local information processing device 2000 is at least one of the followings: a router, a switch, a computer, a mobile phone, a tablet computer, or a television.

A physical distance between the remote server 1000 and the optical network terminal 100 is greater than a physical distance between the local information processing device 2000 and the optical network terminal 100. A connection between the local information processing device 2000 and the remote server 1000 is completed by the optical fiber 101 and the network cable 103, and a connection between the optical fiber 101 and the network cable 103 is completed by the optical module 200 and the optical network terminal 100.

The optical module 200 includes the optical port and the electrical port. The optical port is configured to access the optical fiber 101, so that a bidirectional optical signal connection is established between the optical module 200 and the optical fiber 101. The electrical port is configured to access the optical network terminal 100, so that a bidirectional electrical signal connection is established between the optical module 200 and the optical network terminal 100. Interconversion between the optical signal and the electrical signal is achieved by the optical module 200, so that information connection between the optical fiber 101 and the optical network terminal 100 is established. For example, an optical signal from the optical fiber 101 is converted into an electrical signal by the optical module 200 and then the electrical signal is input into the optical network terminal 100, and an electrical signal from the optical network terminal 100 is converted into an optical signal by the optical module 200 and then the optical signal is input into the optical fiber 101. The optical module 200 is a tool for achieving the interconversion between the optical signal and the electrical signal, and has no function of processing data, therefore, information does not change in the above photoelectric conversion process.

The optical network terminal 100 includes a housing with an approximately rectangular parallelepiped, and an optical module interface 102 and a network cable interface 104 disposed on the housing. The optical module interface 102 is configured to access the optical module 200, so that bidirectional electrical signal connection between the optical network terminal 100 and the optical module 200 is established. And the network cable interface 104 is configured to access the network cable 103, so that bidirectional electrical signal connection between the optical network terminal 100 and the network cable 103 is established. That is, a connection is established between the optical module 200 and the network cable 103 through the optical network terminal 100. For example, the optical network terminal 100 transmits an electrical signal from the optical module 200 to the network cable 103, and transmits an electrical signal from the network cable 103 to the optical module 200. Therefore, the optical network terminal 100, as a master monitor of the optical module 200, may monitor operation of the optical module 200. In addition to the optical network terminal 100, the master monitor of the optical module 200 may further include an optical line terminal (OLT), etc.

A bidirectional signal transmission channel between the remote server 1000 and the local information processing device 2000 has been established through the optical fiber 101, the optical module 200, the optical network terminal 100, and the network cable 103.

Figure 2:
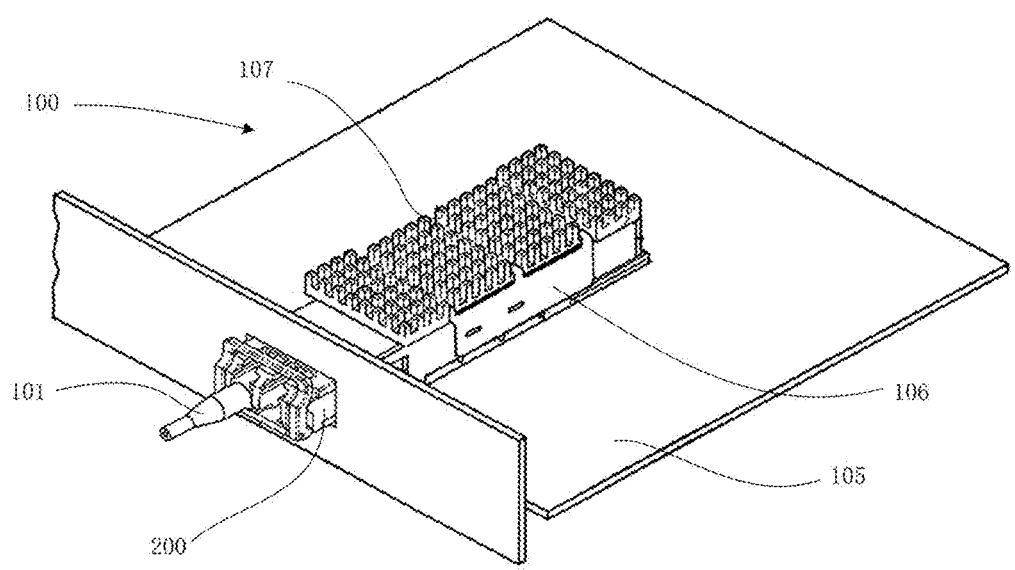
FIG. 2 is a structural diagram of an optical network terminal, in accordance with some embodiments.

FIG. 2 is a diagram showing a structure of an optical network terminal in accordance with some embodiments. In order to clearly show a connection relationship between the optical module 200 and the optical network terminal 100, FIG. 2 only shows a structure of the optical network terminal 100 related to the optical module 200. As shown in FIG. 2, the optical network terminal 100 further includes a circuit board 105 disposed in the housing, a cage 106 disposed on a surface of the circuit board 105, a heat sink 107 disposed on the cage 106, and an electrical connector disposed inside the cage 106. The electrical connector is configured to access the electrical port of the optical module 200. The heat sink 107 has protrusions such as fins for increasing a heat dissipation area.

The optical module 200 is inserted into the cage 106 of the optical network terminal 100, the optical module 200 is fixed by the cage 106, and heat generated by the optical module 200 is conducted to the cage 106 and is dissipated through the heat sink 107. After the optical module 200 is inserted into the cage 106, the electrical port of the optical module 200 is connected to the electrical connector inside the cage 106. In addition, the optical port of the optical module 200 is connected to the optical fiber 101, so that a bidirectional optical signal connection between the optical module 200 and the optical fiber 101 is established.

Figure 3:
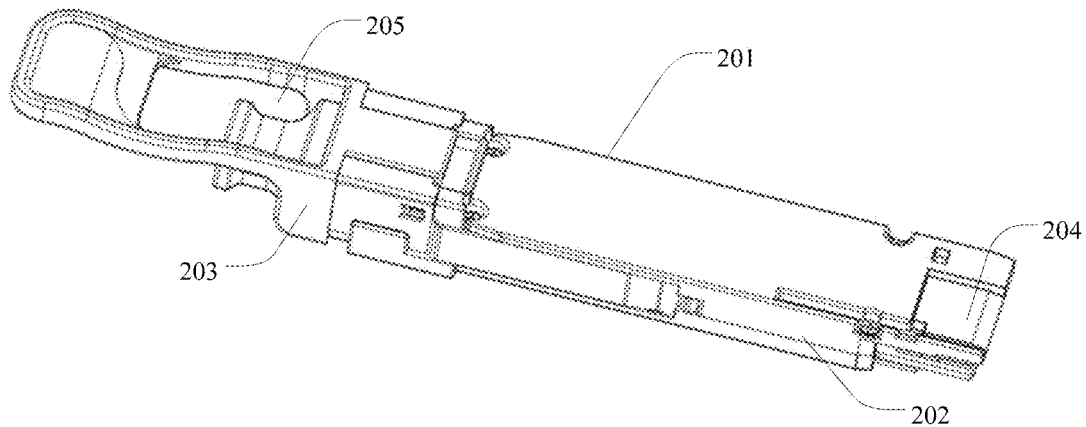
FIG. 3 is a structural diagram of an optical module, in accordance with some embodiments.
Figure 4:
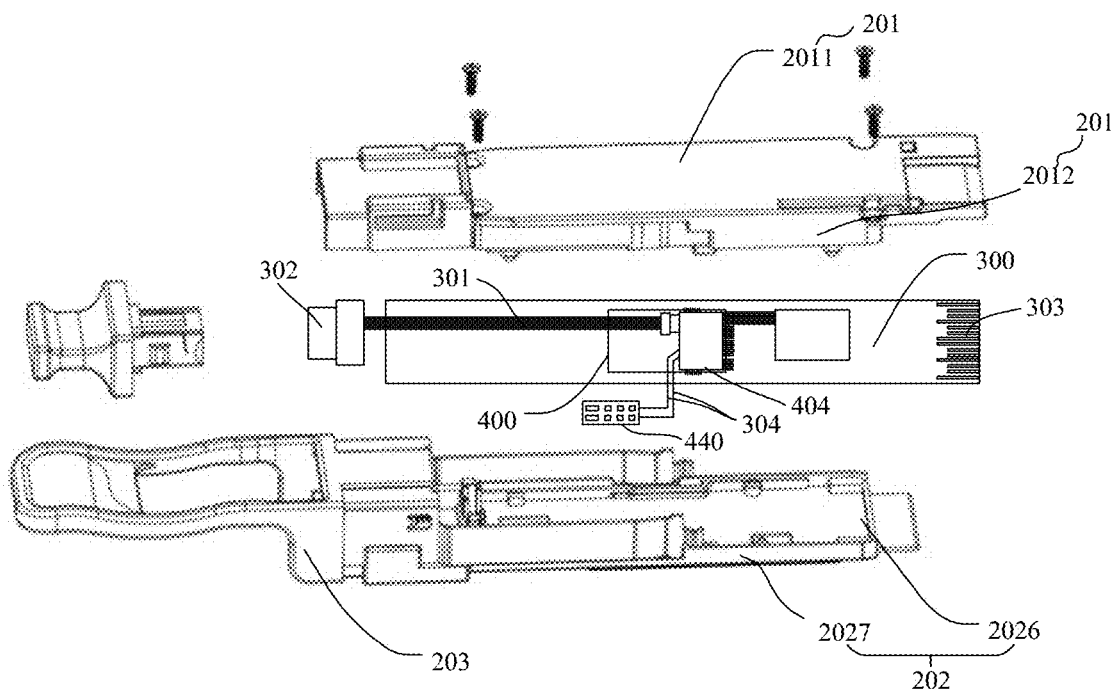
FIG. 4 is an exploded structural diagram of an optical module, in accordance with some embodiments.

FIG. 3 is a structural diagram of an optical module in accordance with some embodiments, and FIG. 4 is an exploded structural diagram of an optical module in accordance with some embodiments. As shown in FIGS. 3 and 4, the optical module 200 includes a shell, a circuit board 300 disposed in the shell, a hollow portion 400 disposed in the circuit board 300, and a light source 440 and a silicon optical chip 404 disposed on an inner wall of the shell and located in the hollow portion 400.

The shell includes an upper shell 201 and a lower shell 202. The upper shell 201 is covered on the lower shell 202 to form the shell with two openings 204 and 205. An outer contour of the shell is generally in a shape of a rectangular parallelepiped.

In some embodiments, the lower shell 202 includes a bottom plate 2026, and two lower side plates 2027 located on both sides of the bottom plate 2026 respectively and perpendicular to the bottom plate 2026. The upper shell 201 includes a cover plate 2011, and the cover plate 2011 covers the two lower side plates 2027 of the lower shell 202 to form the shell.

In some embodiments, the lower shell 202 includes a bottom plate and two lower side plates located on both sides of the bottom plate respectively and perpendicular to the bottom plate. And, the upper shell 201 includes a cover plate 2011 and two upper side plates 2012 located on both sides of the cover plate 2011 respectively and perpendicular to the cover plate 2011, the two upper side plates 2012 and the two lower side plates 2027 are combined to realize that the upper shell 201 is covered on the lower shell 202.

A direction of a connecting line between the opening 204 and the opening 205 may be consistent with a longitudinal direction of the optical module 200, or may not be consistent with the longitudinal direction of the optical module 200. For example, the opening 204 is located at an end of the optical module 200 (the right end in FIG. 3), and the opening 205 is also located at an end of the optical module 200 (the left end in FIG. 3). Alternatively, the opening 204 is located at an end of the optical module 200, and the opening 205 is located at a side of the optical module 200. The opening 204 is the electrical port, a connecting finger of the circuit board 300 extends from the electrical port 204, and definitions for pins of the connecting finger form various industry protocols and specifications, and the connecting finger is configured to be inserted into the master monitor (e.g., the optical network terminal 100). The opening 205 is the optical port, and is configured to access the external optical fiber 101, so that the external optical fiber 101 is connected to the silicon optical chip 404 inside the optical module 200.

By adopting an assembly method that the upper shell 201 is combined with the lower shell 202, it is conductive to install the circuit board 300, the silicon optical chip 404 and other devices into the shell. The upper shell 201 and the lower shell 202 may form encapsulation and protection for these devices. In addition, when assembling the circuit board 300, the light source 404 and the silicon optical chip 404 and other devices, it is possible to facilitate arrangement of positioning components, heat dissipation components, and electromagnetic shielding components of these devices by adopting this assembly method, which is conducive for automated production.

In some embodiments, the upper shell 201 and the lower shell 202 are generally made of a metal material, which facilitates electromagnetic shielding and heat dissipation.

In some embodiments, at least one protrusion is provided on the lower shell 202, and the at least one protrusion is located in the hollow portion 400 and is configured to raise a height for a corresponding device in the hollow portion 400.

In some embodiments, the optical module 200 further includes an unlocking component 203 located on an outer wall of the shell, and the unlocking component 203 is configured to implement or release a fixed connection between the optical module 200 and the master monitor (e.g., the optical network terminal 100).

For example, the unlocking component 203 is located on outer walls of the two lower side plates 2027 of the lower shell 202; and the unlocking component 203 includes an engaging component that matches the cage of the master monitor (e.g., the cage 106 of the optical network terminal 100). When the optical module 200 is inserted into the cage of the master monitor, the engaging component of the unlocking component 203 fixes the optical module 200 in the cage of the master monitor. Based on this, when the unlocking component 203 is pulled, the engaging component of the unlocking component 203 moves accordingly. Furthermore, a connection relationship between the engagement component and the master monitor is changed. Therefore, the engagement relationship between the optical module 200 and the master monitor is released, so that the optical module 200 may be withdrawn from the cage of the master monitor.

The circuit board 300 includes circuit wires, electronic elements, chips, and so on. The electronic elements and the chips are connected electrically according to a circuit design through the circuit wires, so as to realize functions such as power supply, electrical signal transmission, and grounding. The electronic elements may include, for example, a capacitor, a resistor, a triode, or a metal-oxide-semiconductor field-effect transistor (MOSFET). The chips may include, for example, a microcontroller unit (MCU), a clock and data recovery chip (CDR), a power management chip, and a digital signal processor (DSP).

The circuit board 300 is generally a rigid circuit board. The rigid circuit board may further achieve a load-bearing effect due to its hard material. For example, the rigid circuit board may stably carry the electronic elements and the chips. The rigid circuit board may further be inserted into the electrical connector in the cage of the master monitor.

The circuit board 300 further includes a connecting finger 303 formed on an end surface thereof. The connecting finger 303 is composed of a plurality of pins separate from each other. The circuit board 300 is inserted into the cage 106, and is conductively connected to the electrical connector in the cage 106 through the connecting finger 303. The connecting finger 303 may be disposed on only one surface (e.g., an upper surface shown in FIG. 5) of the circuit board 300, or may be disposed on both upper and lower surfaces of the circuit board to adapt to an occasion with a demand for a large number of pins. The connecting finger 303 is configured to establish electrical connection with the master monitor, and the electrical connection may be used to achieve power supply, grounding, I2C communication, and data signal communication, etc.

Of course, a flexible circuit board is further used in some optical modules. As a supplement to the rigid circuit board, the flexible circuit board is generally used in conjunction with the rigid circuit board. For example, the circuit board 300 and the light source 404 may be connected by the flexible circuit board instead of the circuit wires.

In some embodiments, the optical module 200 further includes a first optical fiber ribbon 301, a second optical fiber ribbon 304, and an optical fiber socket 302. The silicon optical chip 404 is connected to an end of the first optical fiber ribbon 301, and another end of the first optical fiber ribbon 301 is connected to the optical fiber socket 302. The optical fiber socket 302 forms the optical port of the optical module 200, and is configured to access the optical fiber 101. The silicon optical chip 404 receives an optical signal of the optical fiber 101 through the first optical fiber ribbon 301, and converts the optical signal into an electrical signal. Alternatively, the silicon optical chip 404 sends an optical signal to outside of the optical module 200 through the first optical fiber ribbon 301.

The silicon optical chip 404 is connected to an end of the second optical fiber ribbon 304, and another end of the second optical fiber ribbon 304 is connected to the light source 440. The silicon optical chip 404 receives light emitted by the light source 440 through the second optical fiber ribbon 304 and modulates the light to generate an optical signal, and the optical signal is transmitted to the outside of the optical module 200 through the first optical fiber ribbon 301.

Figure 5:
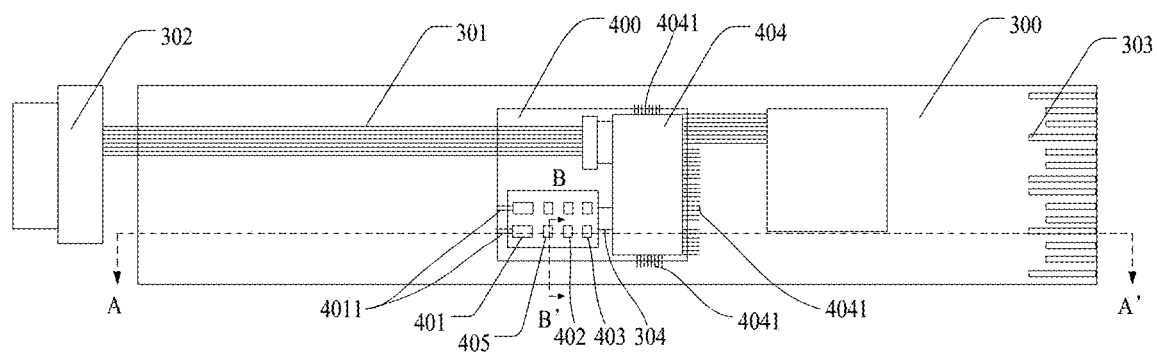
FIG. 5 is a partial structural diagram of an optical module, in accordance with some embodiments.

The present disclosure does not limit a position and shape of the hollow portion 400. For example, as shown in FIG. 5, the shape of the hollow portion 400 is a rectangle and the hollow portion 400 is located in a middle region of the circuit board 300. The hollow portion 400 is formed by removing a material of the circuit board 300.

Figure 6:
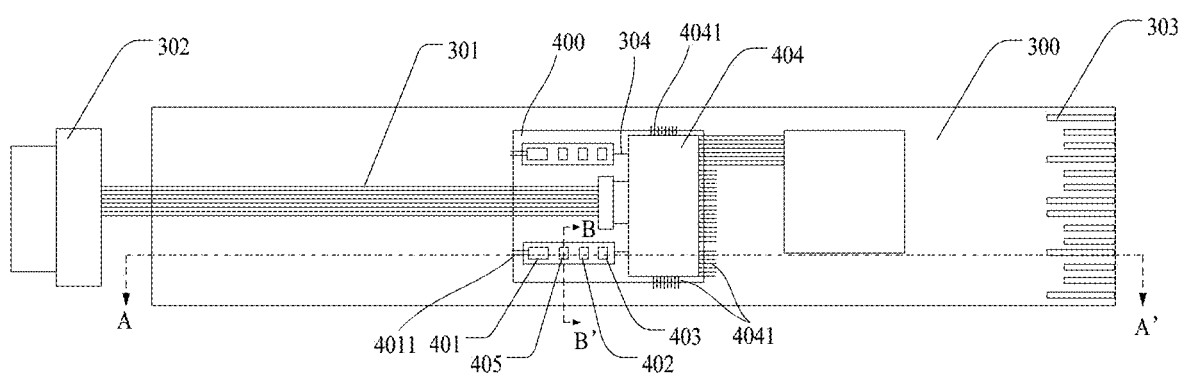
FIG. 6 is another partial structural diagram of an optical module, in accordance with some embodiments.
Figure 7:
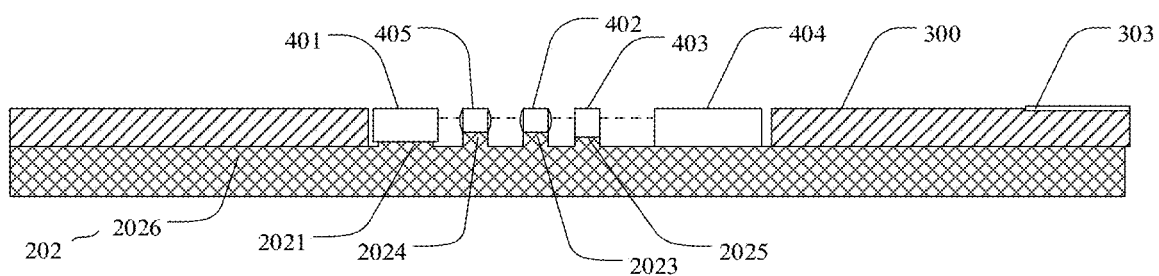
FIG. 7 is a cross-sectional view of the optical module shown in FIG. 5 or FIG. 6 along the line AA'.
Figure 8:
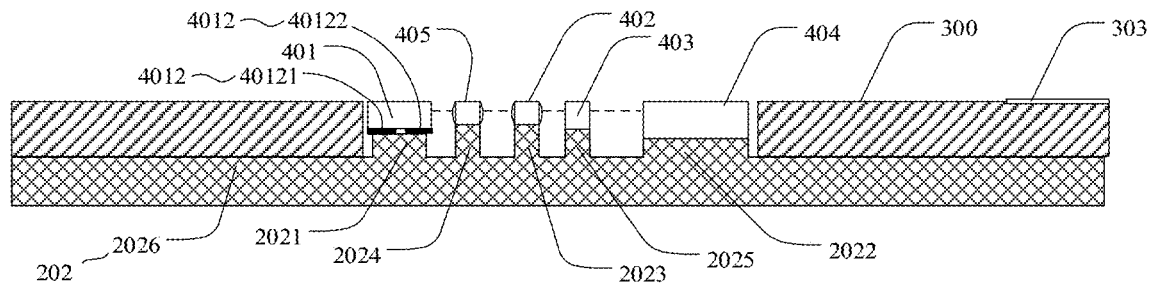
FIG. 8 is another cross-sectional view of the optical module shown in FIG. 5 or FIG. 6 along the line AA'.
Figure 9:
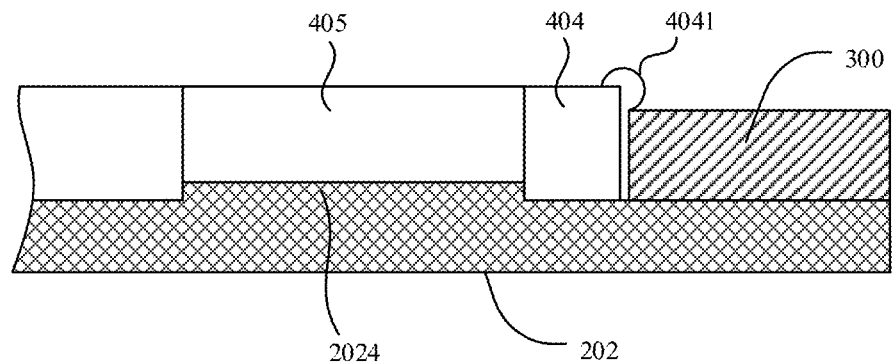
FIG. 9 is a cross-sectional view of the optical module shown in FIG. 5 or FIG. 6 along the line BB'.
Figure 10:
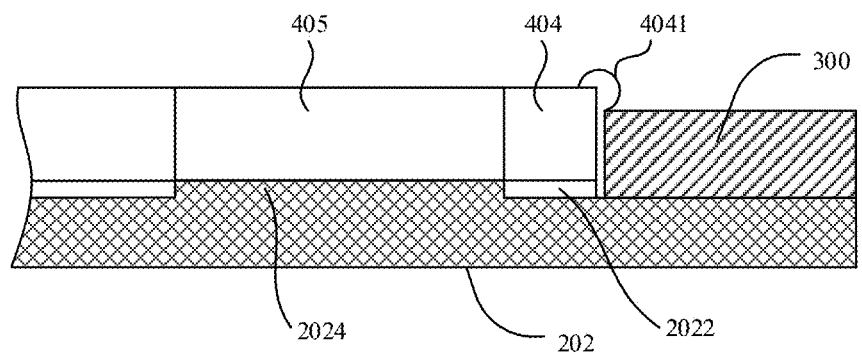
FIG. 10 is another cross-sectional view of the optical module shown in FIG. 5 or FIG. 6 along the line BB'.
Figure 11:
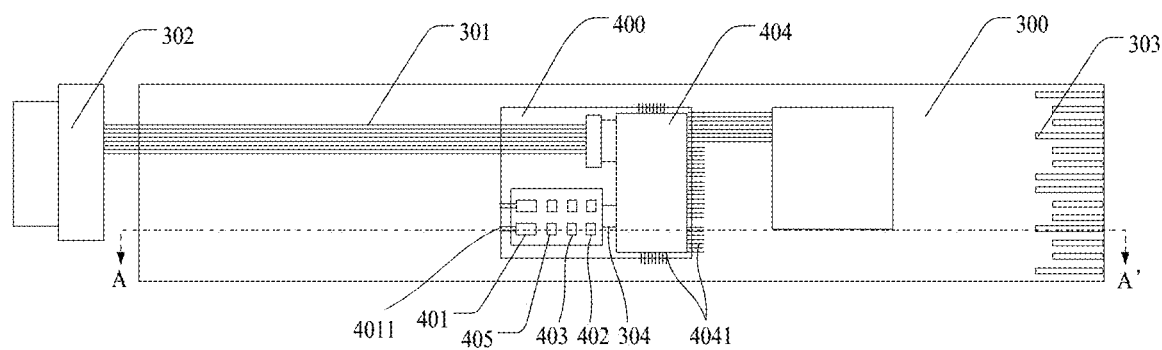
FIG. 11 is yet another partial structural diagram of an optical module, in accordance with some embodiments.
Figure 12:
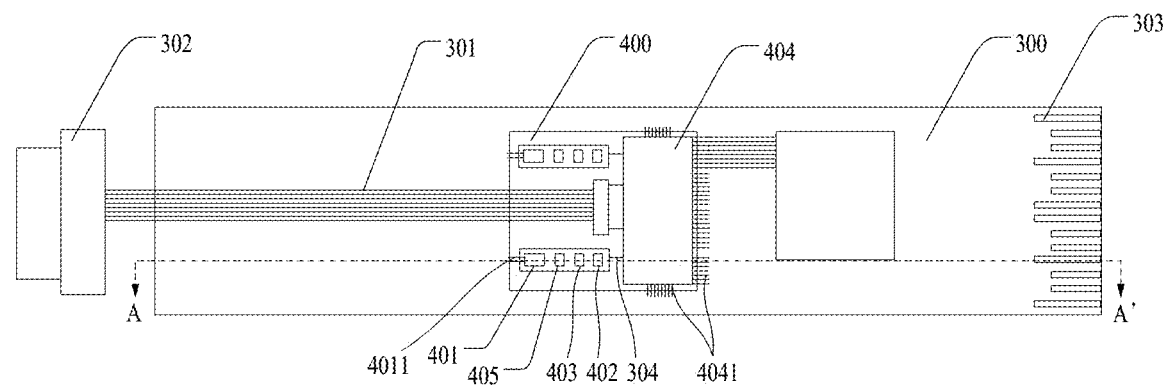
FIG. 12 is yet another partial structural diagram of an optical module, in accordance with some embodiments.
Figure 13:
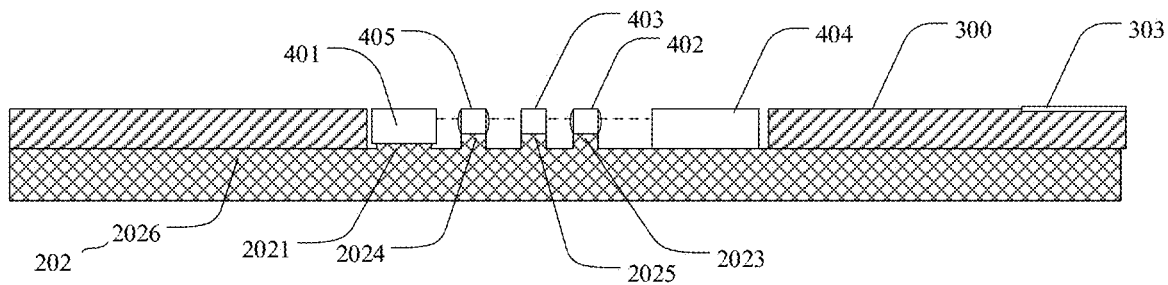
FIG. 13 is a cross-sectional view of the optical module shown in FIG. 11 or FIG. 12 along the line AA'.
Figure 14:
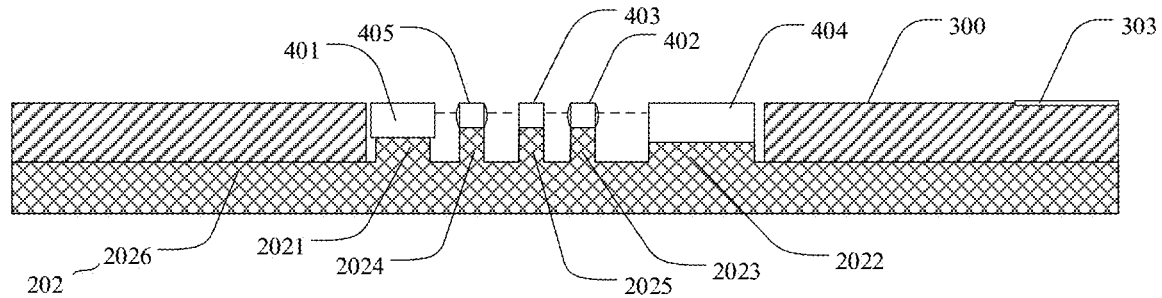
FIG. 14 is another cross-sectional view of the optical module shown in FIG. 11 or FIG. 12 along the line AA'.
Figure 15:
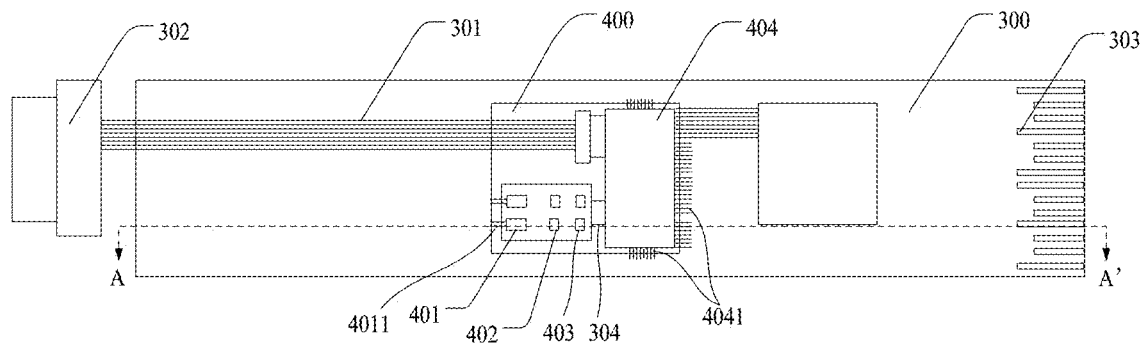
FIG. 15 is yet another partial structural diagram of an optical module, in accordance with some embodiments.
Figure 16:
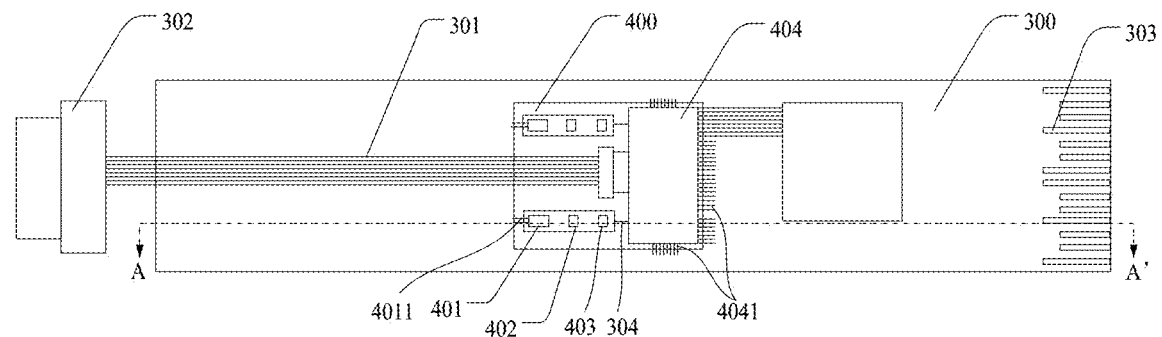
FIG. 16 is yet another partial structural diagram of an optical module, in accordance with some embodiments.
Figure 17:
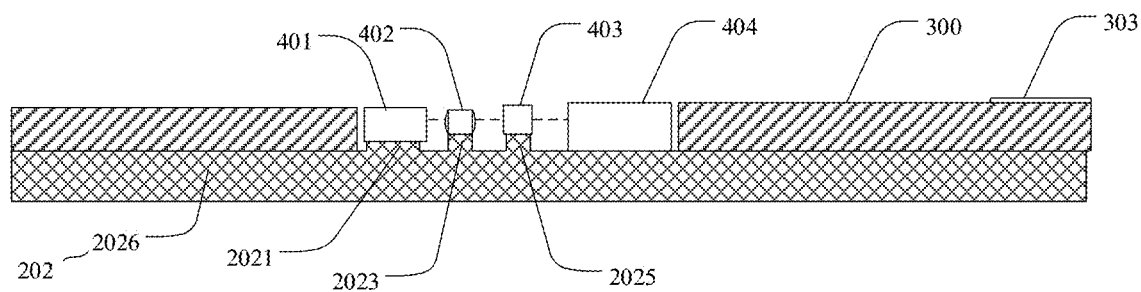
FIG. 17 is a cross-sectional view of the optical module shown in FIG. 15 or FIG. 16 along the line AA'.
Figure 18:
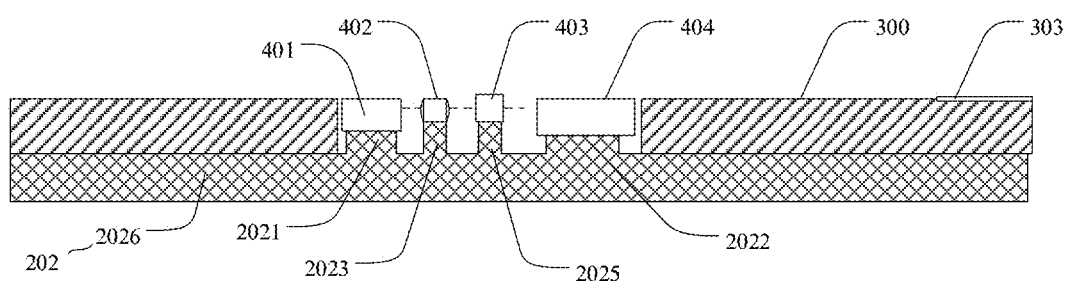
FIG. 18 is another cross-sectional view of the optical module shown in FIG. 15 or FIG. 16 along the line AA'.
Figure 19:
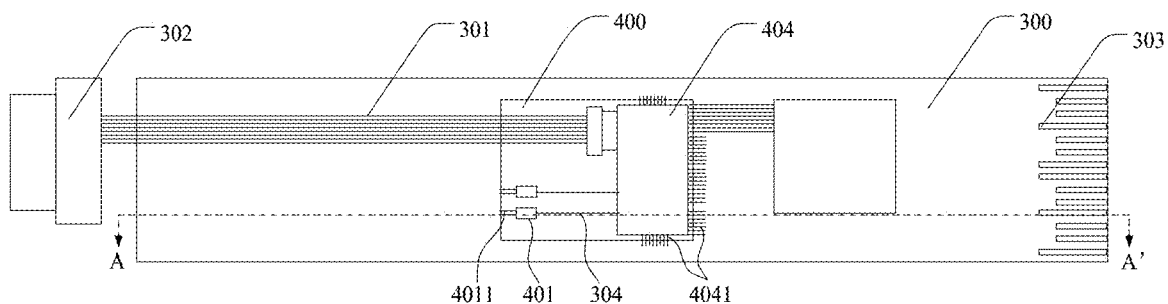
FIG. 19 is yet another partial schematic diagram of an optical module, in accordance with some embodiments.
Figure 20:
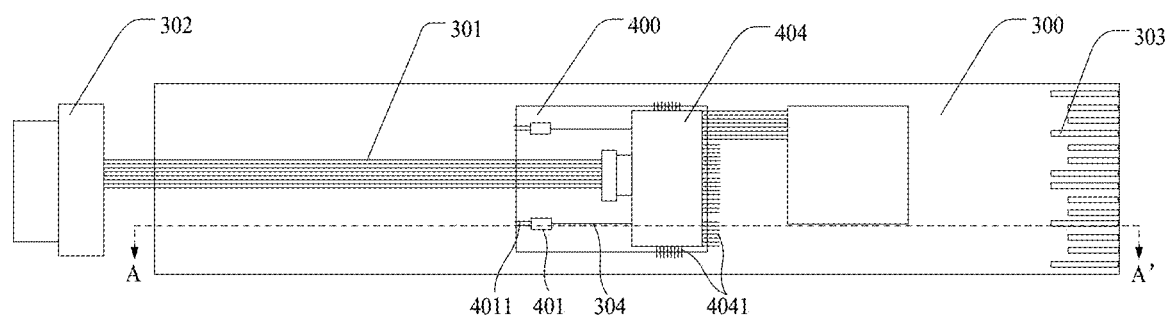
FIG. 20 is yet another partial schematic diagram of an optical module, in accordance with some embodiments.

FIG. 5 is a diagram showing a partial structure of an optical module in accordance with some embodiments. FIG. 6 is a diagram showing another partial structure of an optical module in accordance with some embodiments. FIG. 7 is a cross-sectional view of the optical module shown in FIG. 5 or FIG. 6 along the line AA'. FIG. 8 is another cross-sectional view of the optical module shown in FIG. 5 or FIG. 6 along the line AA'. FIG. 9 is a cross-sectional view of the optical module shown in FIG. 5 or FIG. 6 along the line BB'. FIG. 10 is another cross-sectional view of the optical module shown in FIG. 5 or FIG. 6 along line BB'.

As shown in FIGS. 5 to 10, the silicon optical chip 404 is mounted on the lower shell 202 and is located in the hollow portion 400. The silicon optical chip 404 is connected to the circuit board 300 by wire bonding, and the silicon optical chip 404 is configured to modulate the light emitted by the light source 440 to generate an optical signal, and convert an optical signal outside the optical module 200 into an electrical signal. A plurality of connecting wires 4041 are used when the silicon optical chip 404 is connected to the circuit board 300 by wire bonding.

The silicon optical chip 404 generates a lot of heat during use. The silicon optical chip 404 is directly fixed on the lower shell 202, which removes some barriers between the silicon optical chip 404 and the lower shell 202, and facilitates the heat generated by the silicon optical chip 404 to be dissipated in time through the lower shell 202, so as to avoid affecting working performance of the optical module 200.

The silicon optical chip 404 includes a Mach-Zehnder interferometer, and the Mach-Zehnder interferometer modulates the light emitted by the light source 440. One Mach-Zehnder interferometer is provided with two interference arms, and one light beam is input to each interference arm, so that a total of two light beams of a same wavelength need to be provided to a Mach-Zehnder interferometer. After being modulated by the Mach-Zehnder interferometer, the light beams on the interference arms are merged into one light beam.

Figure 23:
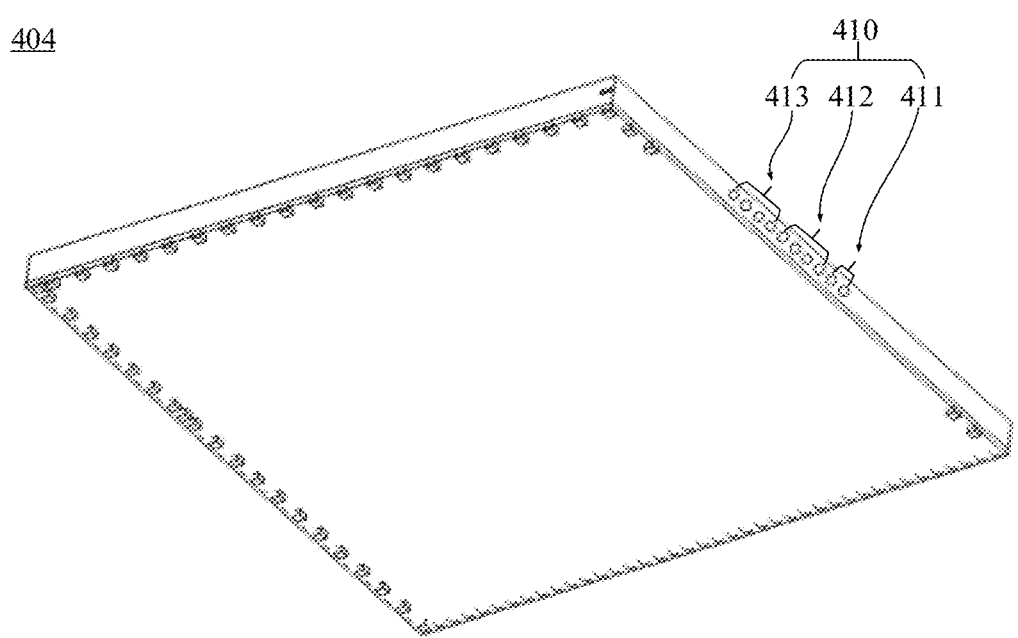
FIG. 23 is a structural diagram of a silicon optical chip, in accordance with some embodiments.

As shown in FIG. 23, the silicon optical chip 404 further includes a plurality of optical waveguide end facets 410. The plurality of optical waveguide end facets 410 are configured to receive the light transmitted by the light source 440, output the modulated optical signals, and receive the optical signals transmitted from the optical fiber 101 to the silicon optical chip 404.

For example, the silicon optical chip 404 includes a first optical waveguide end facet 411, a second optical waveguide end facet 412, and a third optical waveguide end facet 413. The first optical waveguide end facet 411, the second optical waveguide end facet 412, and the third optical waveguide end facet 413 each has a plurality of optical channels. For example, as shown in FIG. 23, the first optical waveguide end facet 411 has two optical channels, the second optical waveguide end facet 412 has four optical channels, and the third optical waveguide end facet 413 has four optical channels.

The first optical waveguide end facet 411 is disposed on a side surface of the silicon optical chip 404. The first optical waveguide end facet 411 is connected to an end of the second optical fiber ribbon 304, and another end of the second optical fiber ribbon 304 is connected to the light source 440. The light emitted from the light source 440 without carrying signals is transmitted to the first optical waveguide end facet 411 through the second optical fiber ribbon 304, and enters the silicon optical chip 404 through the first optical waveguide end facet 411.

The first optical waveguide end facet 411 includes a plurality of optical channels, so multiple paths of light with a same wavelength may be input into the silicon optical chip 404 through these optical channels, and light with the same wavelength is provided for each interference arm of the Mach-Zehnder interferometer.

The second optical waveguide end facet 412 and the third optical waveguide end facet 413 are disposed on a side surface or an upper surface of the silicon optical chip 404. The second optical waveguide end facet 412 and the third optical waveguide end facet 413 are connected to an end of the first optical fiber ribbon 301, and another end of the first optical fiber ribbon 301 is connected to the optical fiber socket 302. An optical signal transmitted by the optical fiber 101 is transmitted to the second optical waveguide end facet 412 through the optical fiber socket 302 and the first optical fiber ribbon 301, and enters the silicon optical chip 404 through the second optical waveguide end facet 412, thereby realizing that the silicon optical chip 404 receives optical signals from the optical fiber 101 outside the optical module 200. The silicon optical chip 404 modulates the light emitted by the light source 440 to generate an optical signal, the optical signal is transmitted to the first optical fiber ribbon 301 through the third optical waveguide end facet 413, and is transmitted to the optical fiber 101 through the first optical fiber ribbon 301 and the optical fiber socket 302, thereby realizing that the silicon optical chip 404 outputs optical signals to the optical fiber 101 outside the optical module 200.

In order to facilitate abutting joint of the first optical fiber ribbon 301 with the second optical waveguide end facet 412 and the third optical waveguide end facet 413, the second optical waveguide end facet 412 and the third optical waveguide end facet 413 are located on the side surface of the silicon optical chip 404. And an angle between an extending direction (a left and right direction as shown in FIG. 5 or FIG. 6) of the first optical fiber ribbon 301 and a normal direction of the second optical waveguide end facet 412 is 0 degree, an angle between the extending direction of the first optical fiber ribbon 301 and a normal direction of the third optical waveguide end facet 413 is also 0 degree. For example, in a case where the second optical waveguide end facet 412 and the third optical waveguide end facet 413 are located on the side surface of the silicon optical chip 404, the side surface where the second optical waveguide end facet 412 and the third optical waveguide end facet 413 are located are perpendicular to the extending direction of the first optical fiber ribbon 301.

In a case where the second optical waveguide end facet 412 and the third optical waveguide end facet 413 are located on the upper surface of the silicon optical chip 404. The angle between an extending direction of the first optical fiber ribbon 301 (an extending direction shown in FIG. 5 or FIG. 6) and a normal direction of the second optical waveguide end facet 412 is approximately 90 degrees, the angle between the extending direction of the first optical fiber ribbon 301 and the normal direction of the third optical waveguide end facet 413 is also approximately 90 degrees. For example, in a case where the second optical waveguide end facet 412 and the third optical waveguide end facet 413 are located on the upper surface of the silicon optical chip 404, the upper surface where the second optical waveguide end facet 412 and the third optical waveguide end facet 413 are located are parallel to the extension direction of the first optical fiber ribbon 301. In this case, in order to facilitate the abutting joint of the first optical fiber ribbon 301 with the second optical waveguide end facet 412 and the third optical waveguide end facet 413, an end of the first optical fiber ribbon 301 adjacent to the second optical waveguide end facet 412 and the third optical waveguide end facet 413 is bent 90 degrees.

Based on a good monochromaticity of a laser, the light source 440 may be a laser light source. The light source 440 may be designed in a form of a laser box, and a box body thereof may have optical devices such as a laser chip and a focusing lens. The laser chip emits laser light which is not modulated and carries no information. The laser light emitted by the laser chip is output to the silicon optical chip 404 after passing through the optical devices such as the focusing lens.

As shown in FIGS. 5 to 8, the light source 440 includes two laser assemblies. Each laser assembly includes a laser chip 401, a collimating lens 405, a focusing lens 402, and an isolator 403. But not limited to this, the light source 440 may alternatively include one laser assembly or more than two laser assemblies.

For example, as shown in FIGS. 5 to 8, the two laser assemblies included in the light source 440 are a first laser assembly and a second laser assembly, respectively. The first laser assembly and the second laser assembly may be located on a same side of the first optical fiber ribbon 301 (as shown in FIG. 5), or may be located on both sides of the first optical fiber ribbon 301 respectively (as shown in FIG. 6).

As shown in FIGS. 7 to 8, the two laser chips 401 are both mounted on the lower shell 202, located in the hollow portion 400 and connected to the circuit board 300 by wire bonding, and the two laser chips 401 are configured to emit light carrying no signals. A plurality of connecting wires 4011 are used when the laser chip 401 is connected to the circuit board 300 by wire bonding (referring to FIG. 5 or FIG. 6).

The laser chip 401 generates a lot of heat during use. The laser chip 401 is directly fixed on the lower shell 202, which removes some barriers between the laser chip 401 and the lower shell 202, so that heat generated by the laser chip 401 may be dissipated in time through the lower shell 202 and avoid affecting working performance of the optical module 200.

In some embodiments, as shown in FIG. 8, the laser assembly further includes a heat sink 4012. The laser chip 401 is disposed on the heat sink 4012, and the heat sink 4012 is mounted on the lower shell 202. A first metal layer 40121 and a second metal layer 40122 that are insulated from each other are formed on a surface of the heat sink 4012. An anode of the laser chip 401 is electrically connected to the first metal layer 40121, a cathode of the laser chip 401 is electrically connected to the second metal layer 40122, and the first metal layer 40121 and the second metal layer 40122 are electrically connected to the circuit board 300 by wire bonding respectively. In this way, the laser chip 401 is electrically connected to the circuit board 300, and the circuit board 300 drives the laser chip 401 to emit light.

That connecting the laser chip 401 and the lower shell 202 through the heat sink 4012 not only helps the laser chip 401 further dissipate heat, but also facilitates the electrical connection between the laser chip 401 and the circuit board 300.

In some embodiments, as shown in FIGS. 7 and 8, a distance between a surface of the laser chip 401 away from the lower shell 202 and a surface of the lower shell 202 close to the circuit board 300 is smaller than a distance between a surface of the circuit board 300 away from the lower shell 202 and the surface of the lower shell 202 close to the circuit board 300. In this case, the lower shell 202 includes a first protrusion 2021 disposed on the bottom plate 2026. The first protrusion 2021 corresponds to a position of the laser chip 401. And the first protrusion 2021 is configured to be disposed on, for example bonded to, the laser chip 401, so that the surface of the laser chip 401 away from the lower shell 202 and the surface of the circuit board 300 away from the lower shell 202 are located on a same horizontal plane, which reduces a length of the connecting wires 4011 used in a wire bonding process.

Figure 21:
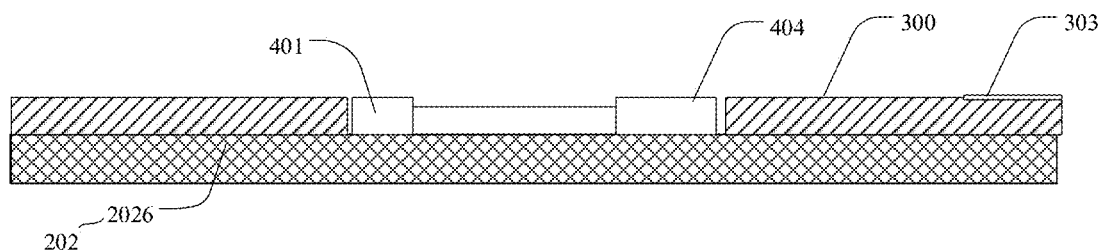
FIG. 21 is a cross-sectional view of the optical module shown in FIG. 19 or FIG. 20 along the line AA'.
Figure 22:
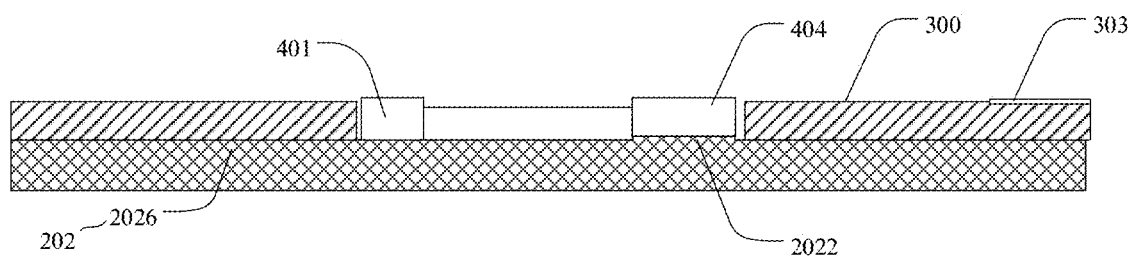
FIG. 22 is another cross-sectional view of the optical module shown in FIG. 19 or FIG. 20 along the line AA'.

In some embodiments, as shown in FIGS. 21 and 22, the distance between the surface of the laser chip 401 away from the lower shell 202 and the surface of the lower shell 202 close to the circuit board 300 is approximately equal to the distance between the surface of the circuit board 300 away from the lower shell 202 and the surface of the lower shell 202 close to the circuit board 300. In this case, the laser chip 401 is directly mounted on the bottom plate 2026 of the lower shell 202, and there is no need to provide a protrusion corresponding to the laser chip 401 on the lower shell 202.

In some embodiments, as shown in FIG. 7, a distance between a surface of the silicon optical chip 404 away from the lower shell 202 and the surface of the lower shell 202 close to the circuit board 300 is approximately equal to the distance of the surface of the circuit board 300 away from the lower shell 202 and the surface of the lower shell 202 close to the circuit board 300. In this case, the silicon optical chip 404 is directly mounted on the bottom plate 2026 of the lower shell 202, and there is no need to provide a protrusion corresponding to the silicon optical chip 404 on the lower shell 202.

In some embodiments, as shown in FIG. 8, the distance between the surface of the silicon optical chip 404 away from the lower shell 202 and the surface of the lower shell 202 close to the circuit board 300 is smaller than the distance of the circuit board 300 away from the lower shell 202 and the surface of the lower shell 202 close to the circuit board 300. In this case, the lower shell 202 includes a second protrusion 2022 provided on the bottom plate 2026. The second protrusion 2022 corresponds to a position of the silicon optical chip 404, and the second protrusion 2022 is configured to be disposed on, for example bonded to, the silicon optical chip 404, so that the surface of the silicon optical chip 404 away from the lower shell 202 and the surface of the circuit board 300 away from the lower shell 202 may be located on a same horizontal plane, which reduces the length of the connecting wires 4041 used in a wire bonding process.

The collimating lens 405 is mounted on the lower shell 202 and is located in the hollow portion 400. The collimating lens 405 is disposed in a light exit direction of the laser chip 401, and located between the laser chip 401 and the silicon optical chip 404. The collimating lens 405 is configured to convert the light without carrying signals emitted by the laser chip 401 into collimated light.

The focusing lens 402 is mounted on the lower shell 202 and is located in the hollow portion 400. The focusing lens 402 is disposed in a light exit direction of the laser chip 401, and located between the laser chip 401 and the silicon optical chip 404. The focusing lens 402 is configured to converge the light emitted by the laser chip 401 without carrying signals, so that it is conductive for the light to couple with the silicon optical chip 404 later.

The isolator 403 is mounted on the lower shell 202 and is located in the hollow portion 400. The isolator 403 is disposed in a light exit direction of the laser chip 401, and located between the laser chip 401 and the silicon optical chip 404. The isolator 403 is configured to prevent the light emitted by the laser chip 401 from returning to the laser chip 401 after being reflected.

In some embodiments, as shown in FIGS. 5 to 8, the collimating lens 405 is located between the laser chip 401 and the focusing lens 402, and the focusing lens 402 is located between the collimating lens 405 and the isolator 403. That is, the collimating lens 405, the focusing lens 402, and the isolator 403 are sequentially arranged along the light exit direction of the laser chip 401. The light emitted from the laser chip 401 enters the silicon optical chip 404 through the collimating lens 405, the focusing lens 402, and the isolator 403 in sequence.

In some embodiments, as shown in FIGS. 11 to 14, the collimating lens 405 is located between the laser chip 401 and the isolator 403, and the isolator 403 is located between the collimating lens 405 and the focusing lens 402. That is, the collimator lens 405, the isolator 403, and the focusing lens 402 are sequentially arranged along the light exit direction of the laser chip 401. The light emitted from the laser chip 401 enters the silicon optical chip 404 through the collimating lens 405, the isolator 403, and the focusing lens 402 in sequence.

On this basis, in a case where the two laser assemblies are located on a same side of the first optical fiber ribbon 301, the two isolators 403 may be replaced by a larger size isolator, so that an optical path is more stable, a manufacturing process is simplified, and the cost is reduced.

In some embodiments, in a case where a height of the first protrusion 2021 is small, the focusing lens 402, the isolator 403, and the collimating lens 405 may be directly mounted on the bottom plate 2026 of the lower shell 202 without providing protrusions corresponding to the focusing lens 402, the isolator 403, and the collimating lens 405. The height of the first protrusion 2021 is a distance from a surface of the first protrusion 2021 away from the lower shell 2021 to the lower shell 2021.

In a case where the height of the first protrusion 2021 is large, in order to make the light emitted by the laser chip 401 without carrying signals enter into the silicon optical chip 404 through the collimating lens 405, the focusing lens 402 and the isolator 403, protrusions corresponding to the collimating lens 405, the focusing lens 402 and the isolator 403 are arranged on the lower shell 202. As shown in FIGS. 7 to 8 and FIGS. 13 to 14, in addition to the first protrusion 2021, the lower shell 202 further includes a third protrusion 2023, a fifth protrusion 2025, and a fourth protrusion 2024. The third protrusion 2023 is disposed on the bottom plate 2026 and corresponds to a position of the focusing lens 402; and the third protrusion 2023 is configured to be disposed on, for example bonded to, the focusing lens 402, so as to fix the focusing lens 402 to the lower shell 202. The fifth protrusion 2025 is disposed on the bottom plate 2026 and corresponds to a position of the isolator 403; and the fifth protrusion 2025 is configured to be disposed on, for example bonded to, the isolator 403, so as to fix the isolator 403 to the lower shell 202. The fourth protrusion 2024 is disposed on the bottom plate 2026 and corresponds to a position of the collimating lens 405, and the fourth protrusion 2024 is configured to be disposed on, for example bonded to, the collimating lens 405, so as to fix the collimating lens 405 to the lower shell 202.

Arrangement of the fourth protrusion 2024, the third protrusion 2023 and the fifth protrusion 2025 makes the light emitted by the laser chip 401 without carrying signals enter into the silicon optical chip 404 through the collimating lens 405, the focusing lens 402, and the isolator 403.

In some embodiments, in a case where the focusing lens 402 is located between the collimating lens 405 and the isolator 403 (as shown in FIGS. 7 and 8), the fourth protrusion 2024 for fixing the collimating lens 405 and the third protrusion 2023 for fixing the focusing lens 402 may form an integrated protrusion.

In some embodiments, the first protrusion 2021, the second protrusion 2022, the third protrusion 2023, the fourth protrusion 2024, and the fifth protrusion 2025 are spaced apart from each other and independent of each other. In this way, a gap is formed between two adjacent protrusions, so as to prevent the heat generated by a device corresponding to one protrusion from affecting other devices.

In some embodiments, the collimating lens 405, the focusing lens 402, and the isolator 403 are not necessary. For example, as shown in FIGS. 19 to 22, the collimating lens 405, the focusing lens 402, and the isolator 403 may be omitted. In this case, the laser assembly includes only the laser chip 401. Alternatively, as shown in FIGS. 15 to 18, the collimating lens 405 may be omitted. In this case, the laser assembly includes the laser chip 401, the focusing lens 402, and the isolator 403. Alternatively, the collimating lens 405 and the focusing lens 402 may be omitted. In this case, the laser assembly includes the laser chip 401 and the isolator 403.

In the optical module provided by some embodiments of the present disclosure, the hollow portion 400 is provided in the circuit board 300, the light source 440 and the silicon optical chip 404 are provided in the hollow portion 400, and the light source 440 and the silicon optical chip 404 are directly fixed on the lower shell 202. As a result, barriers between the light source 440 and the lower shell 202 are removed, and barriers between the silicon optical chip 404 and the lower shell 202 are also removed; therefore, the heat generated by the light source 440 and the silicon optical chip 404 may be dissipated in time conveniently, without affecting the working performance of the optical module 200.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the scope of the present disclosure shall be subject to the protection scope of the claims.

What is claimed is:
1. An optical module, comprising:
a shell;
a circuit board located in the shell and is provided with a hollow portion, and the hollow portion penetrating the circuit board;
a light source mounted on the shell and located in the hollow portion; the light source comprising at least one laser assembly, the at least one laser assembly being electrically connected to the circuit board; and
a silicon optical chip mounted on the shell and located in the hollow portion; the silicon optical chip being electrically connected to the circuit board by wire bonding and being connected to the light source; wherein
the shell comprises a first protrusion and a second protrusion, the first protrusion extends into the hollow portion, and the second protrusion extends into the hollow portion;

the laser assembly comprises a laser chip, and the laser chip is disposed on the first protrusion and is electrically connected to the circuit board by wire bonding; and
the silicon optical chip is disposed on the second protrusion.
2. The optical module according to claim 1, wherein the laser assembly further comprises a heat sink;
the heat sink is mounted on the shell, and the heat sink comprises a first metal layer and a second metal layer that are insulated from each other; and
the first metal layer is electrically connected to an anode of the laser chip and is electrically connected to the circuit board; the second metal layer is electrically connected to a cathode of the laser chip and is electrically connected to the circuit board.
3. The optical module according to claim 1, wherein
the shell further comprises a third protrusion, and the third protrusion is located between the first protrusion and the second protrusion; and
the laser assembly further comprises a focusing lens, and the focusing lens is disposed on the third protrusion.
4. The optical module according to claim 3, wherein
the shell further comprises a fourth protrusion, and the fourth protrusion is located between the first protrusion and the second protrusion; and
the laser assembly further comprises a collimating lens, and the collimating lens is disposed on the fourth protrusion.
5. The optical module according to claim 4, wherein
the shell further comprises a fifth protrusion, and the fifth protrusion is located between the first protrusion and the second protrusion; and
the laser assembly further comprises an isolator, and the isolator is disposed on the fifth protrusion.
6. The optical module according to claim 5, wherein
the fourth protrusion is located between the first protrusion and the third protrusion, and the third protrusion is located between the fourth protrusion and the fifth protrusion; or,
the fourth protrusion is located between the first protrusion and the fifth protrusion, and the fifth protrusion is located between the fourth protrusion and the third protrusion.
7. The optical module according to claim 6, wherein
a height of each protrusion enables light emitted from the laser chip to reach the silicon optical chip after passing through the collimating lens, the focusing lens and the isolator in sequence; or,
the height of each protrusion enables the light emitted from the laser chip to reach the silicon optical chip after passing through the collimating lens, the isolator, and the focusing lens in sequence.
8. The optical module according to claim 6, wherein
the first protrusion, the second protrusion, the third protrusion, the fourth protrusion, and the fifth protrusion are spaced apart from each other, so as to form a gap between every two adjacent protrusions.
9. The optical module according to claim 5, wherein
the fourth protrusion is located between the first protrusion and the third protrusion, and the third protrusion is located between the fourth protrusion and the fifth protrusion; and
the fourth protrusion and the third protrusion form an integrated protrusion.

10. The optical module according to claim 5, wherein
the shell comprises an upper shell and a lower shell, and the upper shell covers the lower shell; and
the first protrusion, the second protrusion, the third protrusion, the fourth protrusion, and the fifth protrusion are all located on the lower shell.

11. The optical module according to claim 10, wherein
the lower shell comprises a bottom plate and two lower side plates located on both sides of the bottom plate respectively and perpendicular to the bottom plate; and
the upper shell comprises a cover plate, the cover plate covers the two lower side plates of the lower shell to form the shell.

12. The optical module according to claim 10, wherein
the lower shell comprises a bottom plate and two lower side plates located on both sides of the bottom plate respectively and perpendicular to the bottom plate;
the upper shell comprises a cover plate and two upper side plates located on both sides of the cover plate respectively and perpendicular to the cover plate; and
the two upper side plates are combined with the two lower side plates so that the upper shell covers the lower shell.

13. The optical module according to claim 1, further comprising:
an optical fiber socket being configured to be connected to an optical fiber outside the optical module;
a first optical fiber ribbon, an end of the first optical fiber ribbon being connected to the silicon optical chip, and another end of the first optical fiber ribbon being connected to the optical fiber socket; and
a second optical fiber ribbon, an end of the second optical fiber ribbon being connected to the silicon optical chip, and another end of the second optical fiber ribbon being connected to the light source.

14. The optical module according to claim 13, wherein the silicon optical chip comprising:
a first optical waveguide end facet disposed on a side surface of the silicon optical chip and connected to the end of the second optical fiber ribbon, and the first optical waveguide end facet being configured to receive light emitted from the light source;
a second optical waveguide end facet disposed on an upper surface or a side surface of the silicon optical chip and connected to the end of the first optical fiber ribbon, and the second optical waveguide end facet being configured to receive an optical signal transmitted by the optical fiber outside the optical module; and
a third optical waveguide end facet disposed on an upper surface or a side surface of the silicon optical chip and connected to the end of the first optical fiber ribbon, and the third optical waveguide end facet being configured to transmit an optical signal obtained by modulating of the silicon optical chip to the outside of the optical module.

15. An optical module, comprising:
a shell;
a circuit board located in the shell and is provided with a hollow portion, and the hollow portion penetrating the circuit board;
a light source mounted on the shell and located in the hollow portion; the light source comprising at least one laser assembly, the at least one laser assembly being electrically connected to the circuit board;
a silicon optical chip mounted on the shell and located in the hollow portion; the silicon optical chip being electrically connected to the circuit board by wire bonding and being connected to the light source; wherein
the shell comprises a first protrusion and a third protrusion that both extend into the hollow portion;
the laser assembly comprises a laser chip and a focusing lens;
the laser chip is disposed on the first protrusion and is electrically connected to the circuit board by wire bonding; and
the focusing lens is disposed on the third protrusion.

16. The optical module according to claim 15, wherein
the shell further comprises a fourth protrusion and a fifth protrusion that both extend into the hollow portion;
the laser assembly further comprises a collimating lens and an isolator;
the collimating lens is disposed on the fourth protrusion; and
the isolator is disposed on the fifth protrusion.

17. The optical module according to claim 15, wherein
the shell further comprises a fifth protrusion that extends into the hollow portion;
the laser assembly further comprises an isolator; and
the isolator is disposed on the fifth protrusion.

18. An optical module, comprising:
a shell;
a circuit board located in the shell and is provided with a hollow portion, and the hollow portion penetrating the circuit board;
a light source mounted on the shell and located in the hollow portion; the light source comprising at least one laser assembly, the at least one laser assembly being electrically connected to the circuit board;
a silicon optical chip mounted on the shell and located in the hollow portion; the silicon optical chip being electrically connected to the circuit board by wire bonding and being connected to the light source;
an optical fiber socket being configured to be connected to an optical fiber outside the optical module;
a first optical fiber ribbon, an end of the first optical fiber ribbon being connected to the silicon optical chip, and another end of the first optical fiber ribbon being connected to the optical fiber socket; and
a second optical fiber ribbon, an end of the second optical fiber ribbon being connected to the silicon optical chip, and another end of the second optical fiber ribbon being connected to the light source; wherein
the shell comprises a first protrusion, and the first protrusion extends into the hollow portion;
the laser assembly comprises a laser chip, and the laser chip is disposed on the first protrusion and is electrically connected to the circuit board by wire bonding; and
the silicon optical chip comprising:
a first optical waveguide end facet disposed on a side surface of the silicon optical chip and connected to the end of the second optical fiber ribbon, and the first optical waveguide end facet being configured to receive light emitted from the light source;
a second optical waveguide end facet disposed on an upper surface or a side surface of the silicon optical chip and connected to the end of the first optical fiber ribbon, and the second optical waveguide end facet being configured to receive an optical signal transmitted by the optical fiber outside the optical module; and
a third optical waveguide end facet disposed on an upper surface or a side surface of the silicon optical chip and connected to the end of the first optical fiber ribbon, and the third optical waveguide end facet being configured to transmit an optical signal obtained by modulating of the silicon optical chip to the outside of the optical module.

* * * * *